US012684902B2

(12) United States Patent
Pai et al.

(10) Patent No.: US 12,684,902 B2
(45) Date of Patent: Jul. 14, 2026

(54) LIGHT EMITTING ELEMENT SUBSTRATE AND DISPLAY APPARATUS

(71) Applicant: AUO Corporation, Hsinchu (TW)

(72) Inventors: Chia-Hui Pai, Hsinchu (TW);
Wen-Hsien Tseng, Hsinchu (TW);
Chien-Hung Kuo, Hsinchu (TW);
Wei-Chieh Chen, Hsinchu (TW);
Kuan-Yi Lee, Hsinchu (TW);
Chih-Chun Yang, Hsinchu (TW)

(73) Assignee: AUO Corporation, Hsinchu City (TW)

( * ) Notice: Subject to any disclaimer, the term of this patent is extended or adjusted under 35 U.S.C. 154(b) by 456 days.

(21) Appl. No.: 18/505,134

(22) Filed: Nov. 9, 2023

(65) Prior Publication Data

US 2024/0355960 A1 Oct. 24, 2024

(30) Foreign Application Priority Data

Apr. 24, 2023 (TW) .................................. 112115117

(51) Int. Cl.
*H10H 20/813* (2025.01)
*H10H 20/857* (2025.01)
*H10H 29/14* (2025.01)

(52) U.S. Cl.
CPC ........ *H10H 20/813* (2025.01); *H10H 20/857* (2025.01); *H10H 29/142* (2025.01)

(58) Field of Classification Search
CPC ... H10H 20/813; H10H 20/857; H10H 29/142
See application file for complete search history.

(56) References Cited

U.S. PATENT DOCUMENTS

| | | | |
|---|---|---|---|
| 11,563,157 B2 | 1/2023 | Chuang et al. | |
| 2019/0051801 A1* | 2/2019 | Seo ...................... | H10H 20/857 |
| 2021/0391517 A1 | 12/2021 | Chuang et al. | |
| 2022/0293832 A1 | 9/2022 | Min et al. | |

FOREIGN PATENT DOCUMENTS

| | | |
|---|---|---|
| CN | 112563387 | 3/2021 |
| CN | 112993134 | 6/2021 |
| CN | 217562594 | 10/2022 |
| TW | 202343835 | 11/2023 |

* cited by examiner

*Primary Examiner* — Samuel A Gebremariam
(74) *Attorney, Agent, or Firm* — JCIPRNET

(57) ABSTRACT

A light emitting element substrate includes a substrate and a light emitting element disposed on the substrate and including first and second semiconductor layers, an active layer, first and second electrodes, and first and second solders. The second semiconductor layer is disposed opposite to the first semiconductor layer. The active layer is disposed between the first and second semiconductor layers. The first and second electrodes are electrically connected to the first and second semiconductor layers respectively. The first and second solders are respectively disposed on and electrically connected to the first and second electrodes respectively. The first electrode includes a first under barrier pattern. The first solder covers the first under barrier pattern. A projection area of the first solder on the substrate is greater than a projection area of the first under barrier pattern on the substrate. A display apparatus is provided.

16 Claims, 7 Drawing Sheets

1

LIGHT EMITTING ELEMENT SUBSTRATE AND DISPLAY APPARATUS

CROSS-REFERENCE TO RELATED APPLICATION

This application claims the priority benefit of Taiwan application serial no. 112115117, filed on Apr. 24, 2023. The entirety of the above-mentioned patent application is hereby incorporated by reference herein and made a part of this specification.

BACKGROUND OF THE INVENTION

Field of the Invention

The invention relates to a light emitting element substrate and a display apparatus.

Description of Related Art

A light emitting diode display panel includes a driving backplane and a plurality of light emitting diode elements transposed onto the driving backplane. Inheriting the characteristics of a light emitting diode, the light emitting diode display panel has advantages such as power saving, high efficiency, high brightness, and fast response time. In addition, compared with organic light emitting diode display panels, the light emitting diode display panel also has advantages such as easy color adjustment, long luminous life, and no image burn-in. Therefore, the light emitting diode display panel is regarded as the next generation display techniques.

In the manufacturing process of the light emitting diode display panel, the light emitting diode elements on the light emitting diode wafer are transferred to a first temporary storage substrate, the light emitting diode elements on the first temporary storage substrate are transferred to a second temporary storage substrate, and the light emitting diode elements on the second temporary storage substrate are transferred to the driving backplane in sequence to complete the light emitting diode display panel. Generally, after the light emitting diode elements are transferred from the first temporary storage substrate to the second temporary storage substrate, a dry etching process is needed to remove the residual adhesive remaining on the light emitting diode elements. However, when the residual adhesive is removed, the layers inside the electrodes of the light emitting diode elements are corroded by the etching gas and cracked, thus causing a decrease in the yield of the light emitting diode display panel.

SUMMARY OF THE INVENTION

The invention provides a light emitting element substrate with high yield.

The invention provides a display apparatus with high yield.

A light emitting element substrate of the invention includes a substrate and a light emitting element disposed on the substrate. The light emitting element includes a first semiconductor layer, a second semiconductor layer, an active layer, a first electrode, a second electrode, a first solder, and a second solder. The second semiconductor layer is disposed opposite to the first semiconductor layer. The active layer is disposed between the first semiconductor layer and the second semiconductor layer. The first electrode and the second electrode are electrically connected to the first semiconductor layer and the second semiconductor layer respectively. The first solder and the second solder are respectively disposed on the first electrode and the second electrode and electrically connected to the first electrode and the second electrode respectively. The first electrode includes a first under barrier pattern. The first solder covers the first under barrier pattern. A projection area of the first solder on the substrate is greater than a projection area of the first under barrier pattern on the substrate.

A display apparatus of the invention includes a driving backplane and a light emitting element. The light emitting element is disposed on the driving backplane and electrically connected to the driving backplane. The light emitting element includes a first semiconductor layer, a second semiconductor layer, an active layer, a first electrode, a second electrode, a first solder, and a second solder. The second semiconductor layer is disposed opposite to the first semiconductor layer. The active layer is disposed between the first semiconductor layer and the second semiconductor layer. The first electrode and the second electrode are electrically connected to the first semiconductor layer and the second semiconductor layer respectively. The first solder and the second solder are respectively disposed on the first electrode and the second electrode and electrically connected to the first electrode and the second electrode respectively. The first electrode includes a first under barrier pattern. The first solder covers the first under barrier pattern. A projection area of the first solder on the driving backplane is greater than a projection area of the first under barrier pattern on the driving backplane.

DESCRIPTION OF THE EMBODIMENTS

Figures 1, 2:
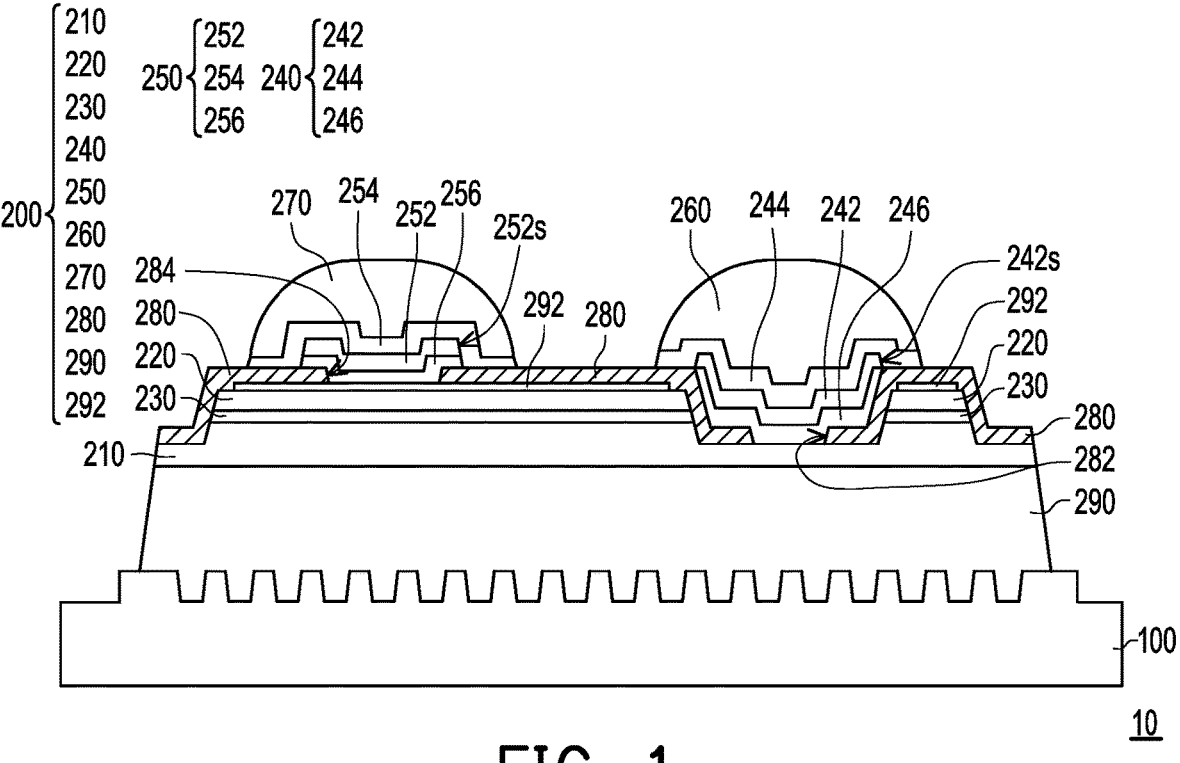
FIG. 1 is a schematic cross-sectional view of a light emitting element substrate of an embodiment of the invention.
FIG. 2 is a schematic top view of a light emitting element substrate of an embodiment of the invention.

Reference will now be made in detail to the exemplary embodiments of the invention, and examples of the exemplary embodiments are illustrated in the accompanying drawings. Wherever possible, the same reference numerals are used in the figures and the descriptions to refer to the same or similar portions.

It should be understood that when an element such as a layer, film, region, or substrate is referred to as being "on" or "connected to" another element, it may be directly on or connected to the other element, or an intermediate element may also be present. On the other hand, when an element is "directly on another element" or "directly connected to" another element, an intermediate element is not present. As used in the present specification, "connected to" may refer to a physical and/or electrical connection. Furthermore, "electrically connected" or "coupled" may mean that other elements are present between two elements.

As used herein, "about", "approximately", or "substantially" includes the stated value and the average within an acceptable deviation range for the particular value as determined by one of ordinary skill in the art, taking into account the measurements in question and the specific amount of error associated with the measurements (i.e., limitations of the measurement system). For example, "about" may represent within one or a plurality of standard deviations of the value, or within ±30%, ±20%, ±10%, or ±5%. Moreover, "about", "similar", or "substantially" used in the present specification may include a more acceptable deviation range or standard deviation according to optical properties, etching properties, or other properties, and one standard deviation does not need to apply to all of the properties.

Unless otherwise stated, all of the terminologies used in the present specification (including technical and scientific terminologies) have the same definition as those commonly understood by those skilled in the art of the invention. It should be further understood that, terminologies defined in commonly-used dictionaries should be interpreted to have the same definitions in related art and in the entire specification of the invention, and are not interpreted as ideal or overly-formal definitions unless clearly stated as such in the present specification.

FIG. 1 is a schematic cross-sectional view of a light emitting element substrate of an embodiment of the invention. FIG. 2 is a schematic top view of a light emitting element substrate of an embodiment of the invention. FIG. 2 shows a substrate 100, a first contact window 282, a second contact window 284, a first under barrier pattern 242, a first upper barrier pattern 244, a second under barrier pattern 252 and a second upper barrier pattern 254, a first solder 260 and a second solder 270, while omitting other members.

Referring to FIG. 1 and FIG. 2, a light emitting element substrate 10 includes the substrate 100 and a light emitting element 200 disposed on the substrate 100. In an embodiment, the substrate 100 may be a growth substrate for epitaxy (for example: a sapphire substrate), and the light emitting element 200 may be a micro light emitting diode (μLED). That is, in an embodiment, the light emitting element substrate 10 may be a light emitting diode wafer, but the invention is not limited thereto.

The light emitting element 200 includes a first semiconductor layer 210, a second semiconductor layer 220 disposed opposite to the first semiconductor layer 210, an active layer 230 disposed between the first semiconductor layer 210 and the second semiconductor layer 220, a first electrode 240 and a second electrode 250 respectively electrically connected to the first semiconductor layer 210 and the second semiconductor layer 220, and the first solder 260 and the second solder 270 respectively disposed on the first electrode 240 and the second electrode 250 and respectively electrically connected to the first electrode 240 and the second electrode 250. In an embodiment, the material of the first solder 260 and the second solder 270 may include tin (Sn), but the invention is not limited thereto.

In an embodiment, the active layer 230 of the light emitting element 200 may be located between the substrate 100 and the first electrode 240 and between the substrate 100 and the second electrode 250. That is, in an embodiment, the first electrode 240 and the second electrode 250 of the light emitting element 200 may face outward, but the invention is not limited thereto.

In an embodiment, the light emitting element 200 may further include an insulating layer 280 disposed on the second semiconductor layer 220 and having the first contact window 282 and the second contact window 284 overlapped with the first semiconductor layer 210 and the second semiconductor layer 220 respectively, and the first electrode 240 and the second electrode 250 can be electrically connected to the first semiconductor layer 210 and the second semiconductor layer 220 respectively via the first contact window 282 and the second contact window 284 of the insulating layer 280. In an embodiment, the insulating layer 280 is, for example, a distributed Bragg reflector (DBR), but the invention is not limited thereto.

In an embodiment, the light emitting element 200 may also optionally include an epitaxial layer 290, the first semiconductor layer 210 is formed on the epitaxial layer 290, the epitaxial layer 290 is located between the substrate 100 and the first semiconductor layer 210, and the first semiconductor layer 210 is located on the epitaxial layer 290 between the active layer 230. For example, in an embodiment, the epitaxial layer 290 can be undoped gallium nitride, the first semiconductor layer 210 can be n-type gallium nitride, the active layer 230 can be multiple quantum wells, and the second semiconductor layer 220 can be p-type GaN, but the invention is not limited thereto.

In an embodiment, the light emitting element 200 may optionally further include an electrical property adjustment layer 292 disposed between the second electrode 250 and the second semiconductor layer 220 and/or between the first electrode 240 and the first semiconductor layer 210. The electrical property adjustment layer 292 has light transmittance and electrical conductivity. In an embodiment, the material of the electrical property adjustment layer 292 is, for example, indium tin oxide, but the invention is not limited thereto.

The first electrode 240 includes a first under barrier pattern 242 disposed between the first solder 260 and the first semiconductor layer 210. In an embodiment, the first electrode 240 may further include an electrically conductive pattern 246, wherein the electrically conductive pattern 246 and the first under barrier pattern 242 are sequentially stacked on the first semiconductor layer 210. In an embodiment, the material of the electrically conductive pattern 246 may include gold (Au), and the material of the first under barrier pattern 242 may include nickel (Ni), aluminum (Al), lead (Pb), or chromium (Cr), but the invention is not limited thereto.

In an embodiment, the first electrode 240 may further include the first upper barrier pattern 244 located between the first solder 260 and the first under barrier pattern 242. The material of the first upper barrier pattern 244 is preferably a corrosion-resistant metal. For example, in an embodiment, the material of the first upper barrier pattern 244 may include nickel (Ni), but the invention is not limited thereto.

The second electrode 250 includes the second under barrier pattern 252 disposed between the second solder 270 and the second semiconductor layer 220. In an embodiment, the second electrode 250 may further include an electrically conductive pattern 256, wherein the electrically conductive pattern 256 and the second under barrier pattern 252 are sequentially stacked on the second semiconductor layer 220. In an embodiment, the material of the electrically conductive pattern 256 may include gold (Au), and the material of the second under barrier pattern 252 may include nickel (Ni), aluminum (Al), lead (Pb), or chromium (Cr), but the invention is not limited thereto.

In an embodiment, the second electrode 250 may further include the second upper barrier pattern 254 located between the second solder 270 and the second under barrier pattern 252. The material of the second upper barrier pattern 254 is preferably a corrosion-resistant metal. For example, in an embodiment, the material of the second upper barrier pattern 254 may include nickel (Ni), but the invention is not limited thereto.

Referring to FIG. 1 and FIG. 2, it is worth noting that the first solder 260 covers the first under barrier pattern 242, and the projection area of the first solder 260 on the substrate 100 is greater than the projection area of the first under barrier pattern 242 on the substrate 100. In an embodiment, the first solder 260 covers a sidewall 242s of the first under barrier pattern 242.

Referring to FIG. 2, in an embodiment, the first solder 260 has a first edge 260e1 and a second edge 260e2 opposite to each other, the first edge 260e1 and the second edge 260e2 of the first solder 260 are arranged sequentially in a first direction x, the first under barrier pattern 242 has a first edge 242e1 and a second edge 242e2 opposite to each other, the first edge 242e1 and the second edge 242e2 of the first under barrier pattern 242 are arranged sequentially in the first direction x, there is a distance X1_$n$ between the first edge 260e1 of the first solder 260 and the first edge 242e1 of the first under barrier pattern 242 in the first direction x, and there is a distance X2_$n$ between the second edge 260e2 of the first solder 260 and the second edge 242e2 of the first under barrier pattern 242 in the first direction x.

In an embodiment, the first solder 260 further has a third edge 260e3 and a fourth edge 260e4, the third edge 260e3 of the first solder 260 is connected between the first edge 260e1 and the second edge 260e2 of the first solder 260, the fourth edge 260e4 of the first solder 260 is connected between the first edge 260e1 and the second edge 260e2 of the first solder 260 and disposed opposite to the third edge 260e3 of the first solder 260, the third edge 260e3 and the fourth edge 260e4 of the first solder 260 are arranged sequentially in a second direction y, the first direction x and the second direction y are intersected, the first under barrier pattern 242 further has a third edge 242e3 and a fourth edge 242e4, the third edge 242e3 of the first under barrier pattern 242 is connected between the first edge 242e1 and the second edge 242e2 of the first under barrier pattern 242, the fourth edge 242e4 of the first under barrier pattern 242 is connected between the first edge 242e1 and the second edge 242e2 of the first under barrier pattern 242 and disposed opposite to the third edge 242e3 of the first under barrier pattern 242, the third edge 242e3 and the fourth edge 242e4 of the first under barrier pattern 242 are arranged sequentially in the second direction y, there is a distance Y1_$n$ between the third edge 260e3 of the first solder 260 and the third edge 242e3 of the first under barrier pattern 242 in the second direction y, and there is a distance Y2_$n$ between the fourth edge 260e4 of the first solder 260 and the fourth edge 260e4 of the first under barrier pattern 242 in the second direction y.

Referring to FIG. 1 and FIG. 2, in an embodiment, the first upper barrier pattern 244 covers the first under barrier pattern 242, and the projection area of the first upper barrier pattern 244 on the substrate 100 is greater than the projection area of the first under barrier pattern 242 on the substrate 100. In an embodiment, the first upper barrier pattern 244 covers the sidewall 242s of the first under barrier pattern 242.

Referring to FIG. 2, in an embodiment, the vertical projection of the first upper barrier pattern 244 on the substrate 100 and the vertical projection of the first solder 260 on the substrate 100 can be substantially overlapped; the projection area of the first upper shield pattern 244 on the substrate 100 may be substantially equal to the projection area of the first solder 260 on the substrate 100; but the invention is not limited thereto.

Referring to FIG. 1 and FIG. 2, in an embodiment, the second solder 270 covers the second under barrier pattern 252, and the projection area of the second solder 270 on the substrate 100 is greater than the projection area of the second under barrier pattern 252 on the substrate 100. In an embodiment, the second solder 270 covers a sidewall 252s of the second under barrier pattern 252 of the second electrode 250.

Referring to FIG. 2, in an embodiment, the second solder 270 has a first edge 260e1 and a second edge 260e2 opposite to each other, the first edge 270e1 and the second edge 270e2 of the second solder 270 are arranged sequentially in the first direction x, the second under barrier pattern 252 has a first edge 252e1 and a second edge 252e2 opposite to each other, the first edge 252e1 and the second edge 252e2 of the second under barrier pattern 252 are arranged sequentially in the first direction x, there is a distance X1_$p$ between the first edge 270e1 of the second solder 270 and the first edge 252e1 of the second under barrier pattern 252 in the first direction x, and there is a distance X2_$p$ between the second edge 270e2 of the second solder 270 and the second edge 252e2 of the second under barrier pattern 252 in the first direction x.

In an embodiment, the second solder 270 further has the third edge 260e3 and the fourth edge 260e4, the third edge 260e3 of the second solder 270 is connected between the first edge 260e1 and the second edge 260e2 of the second solder 270, the fourth edge 270e4 of the second solder 270 is connected between the first edge 270e1 and the second edge 270e2 of the second solder 270 and disposed opposite to the third edge 270e3 of the second solder 270, the third edge 270e3 and the fourth edge 270e4 of the second solder 270 are arranged sequentially in the second direction y, the second under barrier pattern 252 further has a third edge 252e3 and a fourth edge 252e4, the third edge 252e3 of the second under barrier pattern 252 is connected between the first edge 252e1 and the second edge 252e2 of the second under barrier pattern 252, the fourth edge 252e4 of the second under barrier pattern 252 is connected between the first edge 252e1 and the second edge 252e2 of the second under barrier pattern 252 and disposed opposite to the third edge 252e3 of the second under barrier pattern 252, the third edge 252e3 and the fourth edge 252e4 of the second under barrier pattern 252 are arranged sequentially in the second direction y, there is a distance Y1_p between the third edge 270e3 of the second solder 270 and the third edge 252e3 of the second under barrier pattern 252 in the second direction y, and there is a distance Y2_p between the fourth edge 270e4 of the second solder 270 and the fourth edge 252e4 of the second under barrier pattern 252 in the second direction y.

Referring to FIG. 1 and FIG. 2, in an embodiment, the second upper barrier pattern 254 covers the second under barrier pattern 252, and the projection area of the second upper barrier pattern 254 on the substrate 100 is greater than the projection area of the second under barrier pattern 252 on the substrate 100. In an embodiment, the second upper barrier pattern 254 covers the sidewall 252s of the second under barrier pattern 252.

In an embodiment, the vertical projection of the second upper barrier pattern 254 on the substrate 100 and the vertical projection of the second solder 270 on the substrate 100 can be substantially overlapped, the projection area of the second upper shield pattern 254 on the substrate 100 may be substantially equal to the projection area of the second solder 270 on the substrate 100, but the invention is not limited thereto.

It should be mentioned that, the embodiments below use the same reference numerals and portions of the content from previous embodiments. Specifically, the same reference numerals are used to represent the same or similar elements, and the descriptions for the same techniques are omitted. The omitted portions are as described in the embodiments above and are not repeated in the embodiments below.

Figure 3:
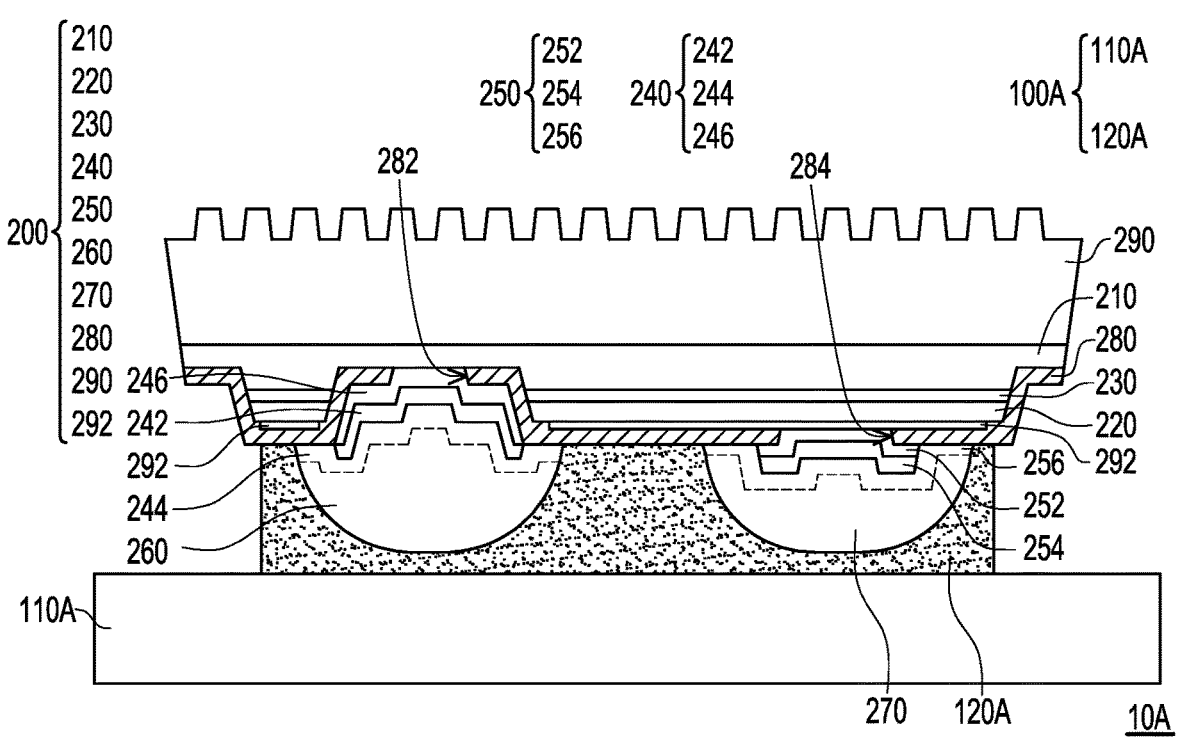
FIG. 3 is a schematic cross-sectional view of a light emitting element substrate of another embodiment of the invention.
Figure 4:
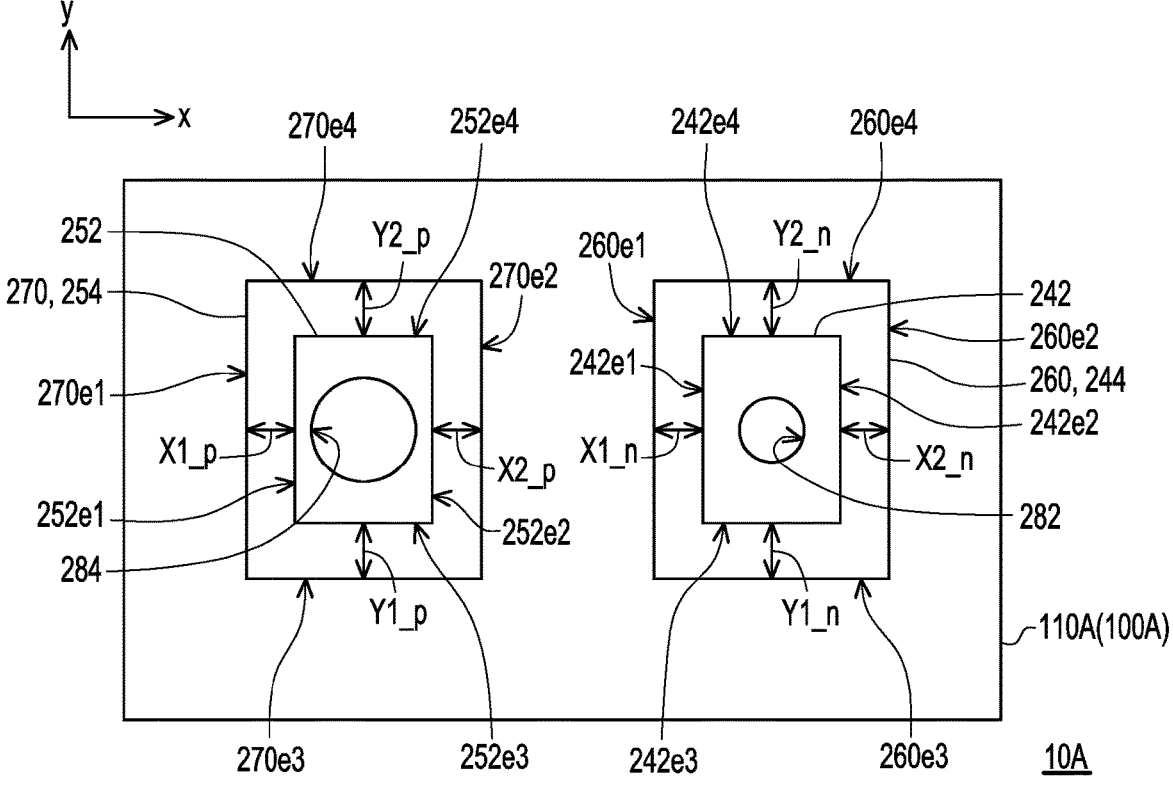
FIG. 4 is a schematic top view of a light emitting element substrate of another embodiment of the invention.

FIG. 3 is a schematic cross-sectional view of a light emitting element substrate of another embodiment of the invention. FIG. 4 is a schematic top view of a light emitting element substrate of another embodiment of the invention. FIG. 4 shows a substrate 100A, the first contact window 282, the second contact window 284, the first under barrier pattern 242, the first upper barrier pattern 244, the second under barrier pattern 252, the second upper barrier pattern 254, the first solder 260 and the second solder 270, while omitting other members.

A light emitting element substrate 10A of FIG. 3 and FIG. 4 is similar to the light emitting element substrate 10 of FIG. 1 and FIG. 2, and the difference between the two is: the substrate 100A of the light emitting element substrate 10A of FIG. 3 and FIG. 4 is different from the substrate 100 of the light emitting element substrate 10 of FIG. 1 and FIG. 2.

Please refer to FIG. 3 and FIG. 4, in detail, in an embodiment, the substrate 100A may include a first temporary storage base 110A and a first adhesive layer 120A disposed on the first temporary storage base 110A, and the light emitting element 200 can be transposed from a light emitting diode wafer (such as the light emitting element substrate 100 of FIG. 1) onto the first adhesive layer 120A by using a laser lift-off (LLO) method. In an embodiment, the first solder 260 is located between the first electrode 240 and the first adhesive layer 120A, and the second solder 270 is located between the second electrode 250 and the first adhesive layer 120A. That is, in an embodiment, the first electrode 240 and the second electrode 250 of the light emitting element 200 may face the substrate 100A.

In an embodiment, the material of the first under barrier pattern 242 may be heavier than the material of the first solder 260. During the process of transposing the light emitting element 200 from the light emitting diode wafer (such as the light emitting element substrate 100 of FIG. 1) onto the first adhesive layer 120A, the light emitting element 200 is heated, the electrically conductive pattern 246 and the first upper barrier pattern 244 are fused with the first solder 260, and the heavier first under barrier pattern 242 may be not diffused, but the invention is not limited thereto. In an embodiment, the material of the second under barrier pattern 252 may be heavier than the material of the second solder 270. During the process of transposing the light emitting element 200 from the light emitting diode wafer (such as the light emitting element substrate 100 of FIG. 1) onto the first adhesive layer 120A, the light emitting element 200 is heated, the electrically conductive pattern 256 and the second upper barrier pattern 254 are fused with the second solder 270, and the second under barrier pattern 252 may be not diffused, but the invention is not limited thereto.

Figures 5, 6:
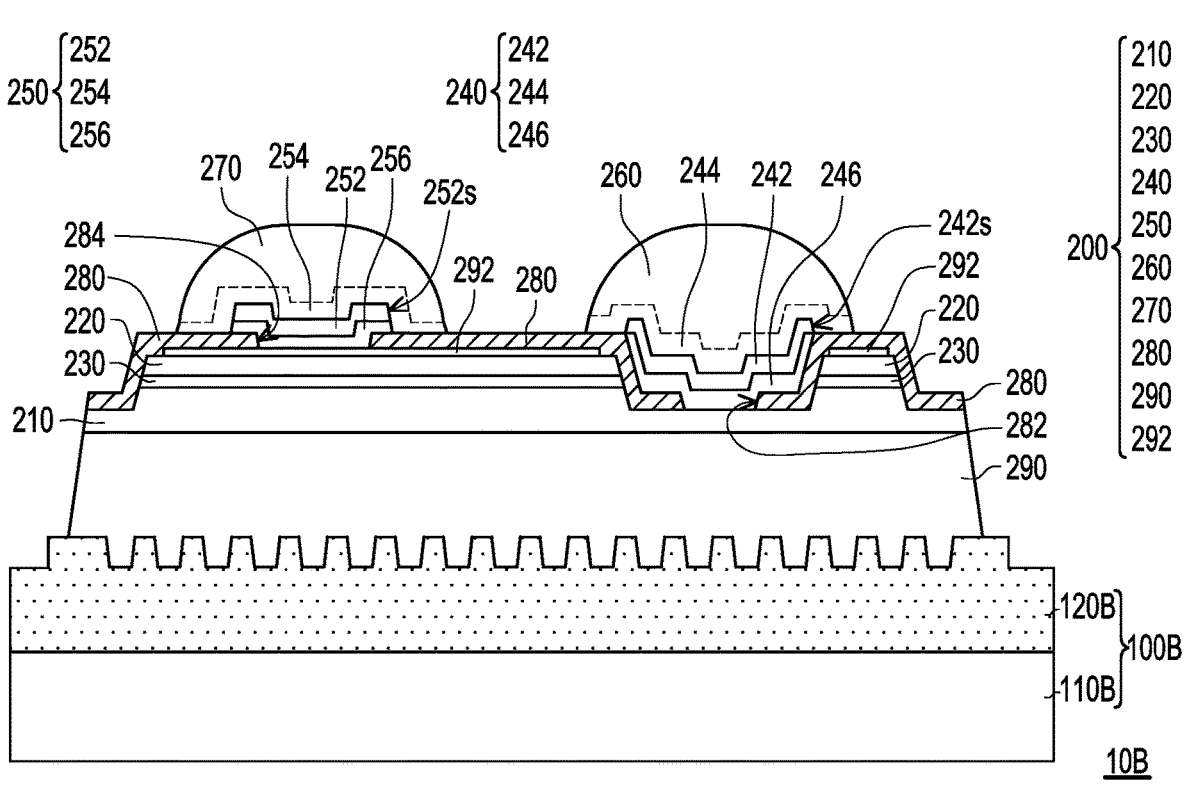
FIG. 5 is a schematic cross-sectional view of a light emitting element substrate of another embodiment of the invention.
FIG. 6 is a schematic top view of a light emitting element substrate of another embodiment of the invention.

FIG. 5 is a schematic cross-sectional view of a light emitting element substrate of another embodiment of the invention. FIG. 6 is a schematic top view of a light emitting element substrate of another embodiment of the invention. FIG. 6 shows a substrate 100B, the first contact window 282, the second contact window 284, the first under barrier pattern 242, the first upper barrier pattern 244, the second under barrier pattern 252, the second upper barrier pattern 254, the first solder 260 and the second solder 270, while omitting other members.

A light emitting element substrate 10B of FIG. 5 and FIG. 6 is similar to the light emitting element substrate 10 of FIG. 1 and FIG. 2, and the difference between the two is: the substrate 100B of the light emitting element substrate 10B of FIG. 5 and FIG. 6 is different from the substrate 100 of the light emitting element substrate 10 of FIG. 1 and FIG. 2.

Please refer to FIG. 5 and FIG. 6, in detail, in an embodiment, the substrate 100B includes a second temporary storage base 110B and a second adhesive layer 120B disposed on the second temporary storage base 110B, and the light emitting element 200 is transposed from the first temporary storage base 110A (drawn in FIG. 3) onto the second temporary storage base 110B. After the light emitting element 200 is transferred from the first temporary storage base 110A (shown in FIG. 3) to the second temporary storage base 110B, a portion of the first adhesive layer 120A (not shown in FIG. 5; refer to FIG. 3) remains on the first solder 260 and the second solder 270 of the light emitting element 200, and the remaining portion of the first adhesive layer 120A needs to be removed. It is worth mentioning that since the first solder 260 covers the first under barrier pattern 242 and the second solder 270 covers the second under barrier pattern 252, during the process of removing the remaining portion of the first adhesive layer 120A, the etching gas does not readily corrode the covered first under barrier pattern 242/second under barrier pattern 252. In this way, the first electrode 240/the second electrode 250 of the light emitting element 200 on the second temporary storage base 110B are less likely to be cracked, thus helping to improve the yield of a subsequent display apparatus 10C (drawn in FIG. 7).

Figure 7:
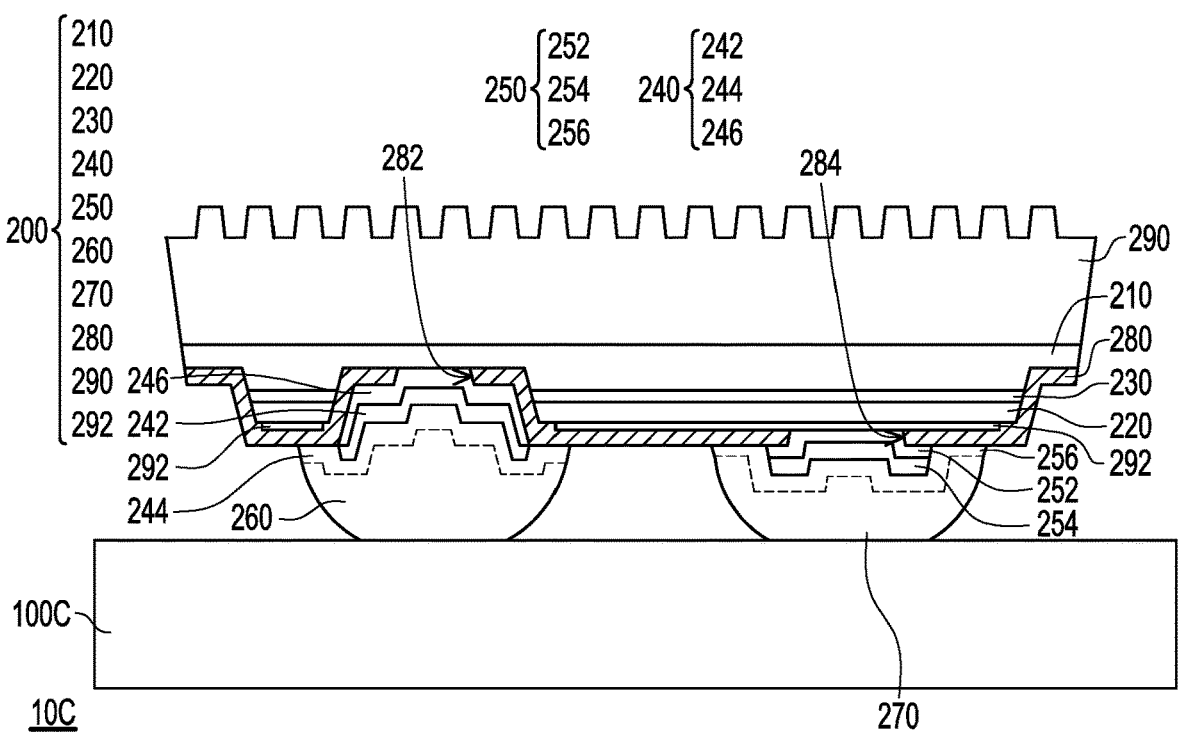
FIG. 7 is a schematic cross-sectional view of a display apparatus of an embodiment of the invention.
Figure 8:
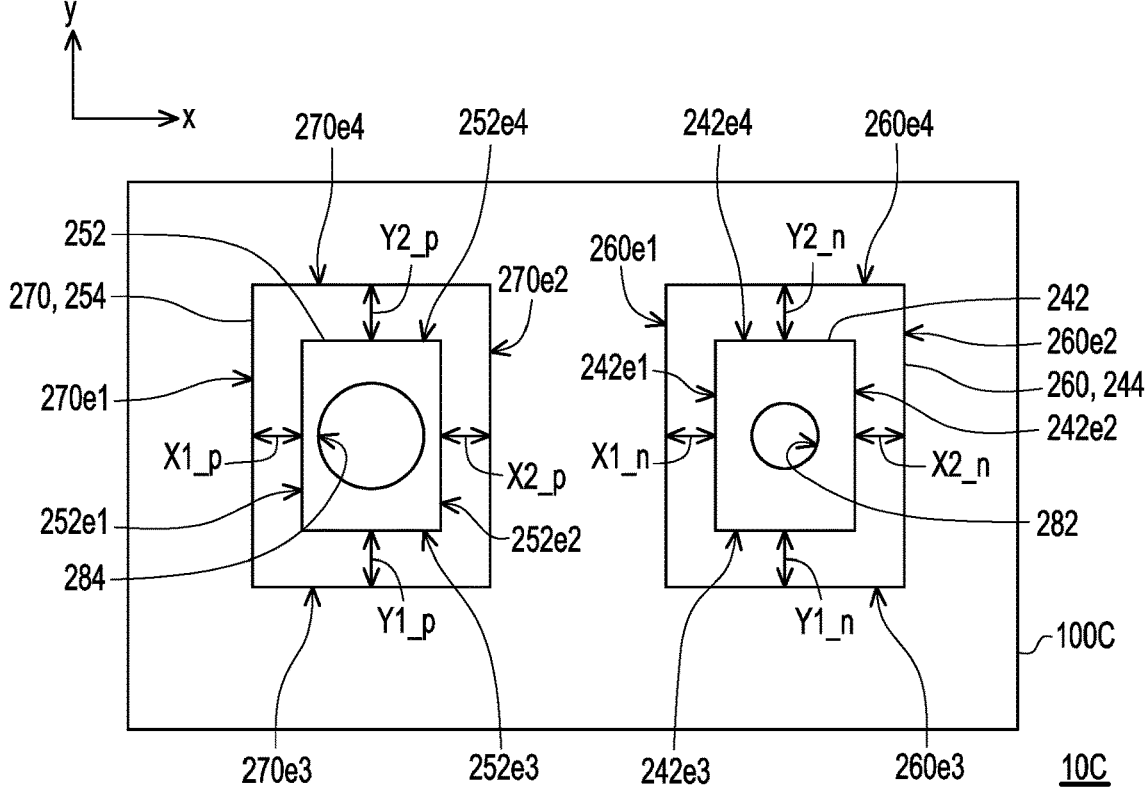
FIG. 8 is a schematic top view of a display apparatus of an embodiment of the invention.

FIG. 7 is a schematic cross-sectional view of a display apparatus of an embodiment of the invention. FIG. 8 is a schematic top view of a display apparatus of an embodiment of the invention. FIG. 8 shows a substrate 100C, the first contact window 282, the second contact window 284, the first under barrier pattern 242, the first upper barrier pattern 244, the second under barrier pattern 252 and the second upper barrier pattern 254, the first solder 260 and the second solder 270, while omitting other members.

Referring to FIG. 5 and FIG. 7, the light emitting element 200 on the second temporary storage base 110B (drawn in FIG. 5) is transferred onto the substrate 100C, and the light emitting element 200 is electrically connected to the substrate 100C to form the display apparatus 10C, wherein the substrate 100C is a driving backplane.

The display apparatus 10C of FIG. 7 and FIG. 8 is similar to the light emitting element substrate 10A of FIG. 3 and FIG. 4, and the difference between the two is that the substrate 100C of the display apparatus 10C of FIG. 7 and FIG. 8 is a driving backplane. Referring to FIG. 7 and FIG. 8, the display apparatus 10C includes the substrate 100C and the light emitting element 200 electrically connected to the substrate 100C. In detail, the substrate 100C (i.e., the driving backplane) includes a pixel driving circuit (not shown) and a plurality of contact pads (not shown) electrically connected to the pixel driving circuit, and the first solder 260 and the second solder 270 of the light emitting element 200 are respectively electrically connected to the plurality of contact pads. For example, in an embodiment, the pixel driving circuit may include a data line (not shown), a scan line (not shown), a power line (not shown), a common line (not shown), a first transistor (not shown), a second transistor (not shown), and a capacitor (not shown), wherein the first end of the first transistor is electrically connected to the data line, the control end of the first transistor is electrically connected to the scan line, the second end of the first transistor is electrically connected to the control end of the second transistor, the first end of the second transistor is electrically connected to the power line, the capacitor is electrically connected to the second end of the first transistor and the first end of the second transistor, one of the plurality of contact pads is electrically connected to the first end of the second transistor, and another of the plurality of contact pads is electrically connected to the common line. However, the invention is not limited thereto, and in other embodiments, the pixel driving circuit may also be other types of circuits.

Figure 9:
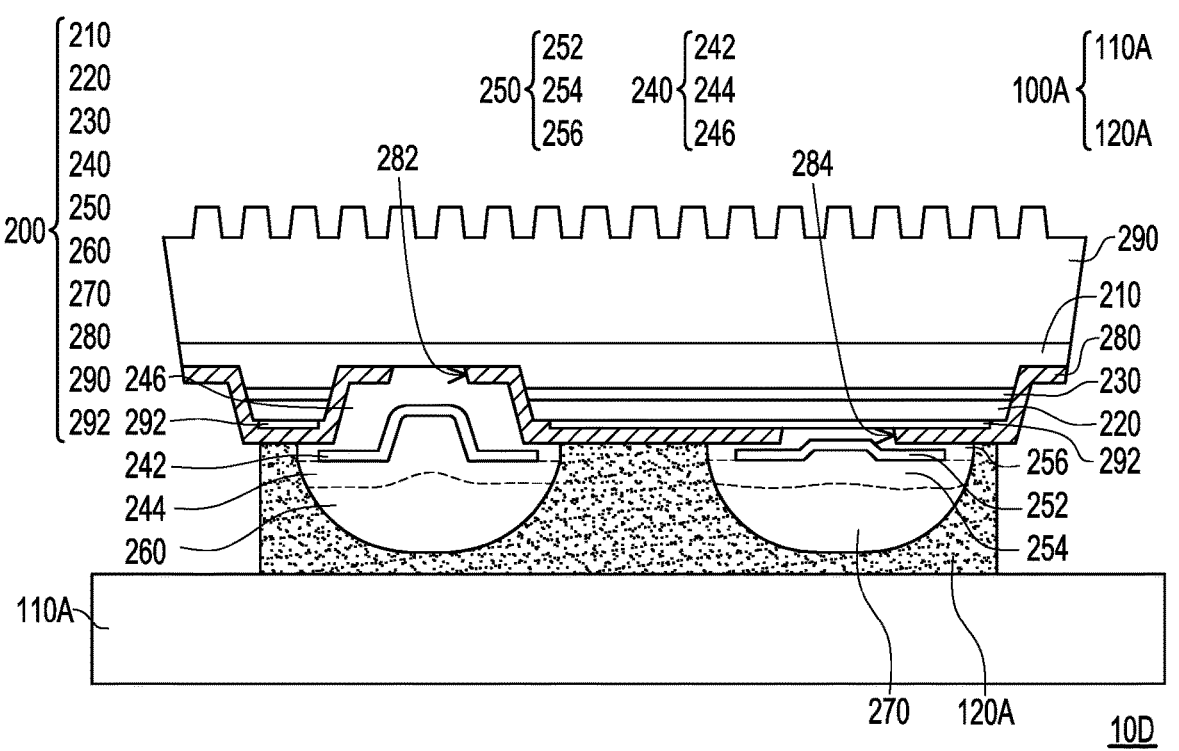
FIG. 9 is a schematic cross-sectional view of a light emitting element substrate of another embodiment of the invention.
Figure 10:
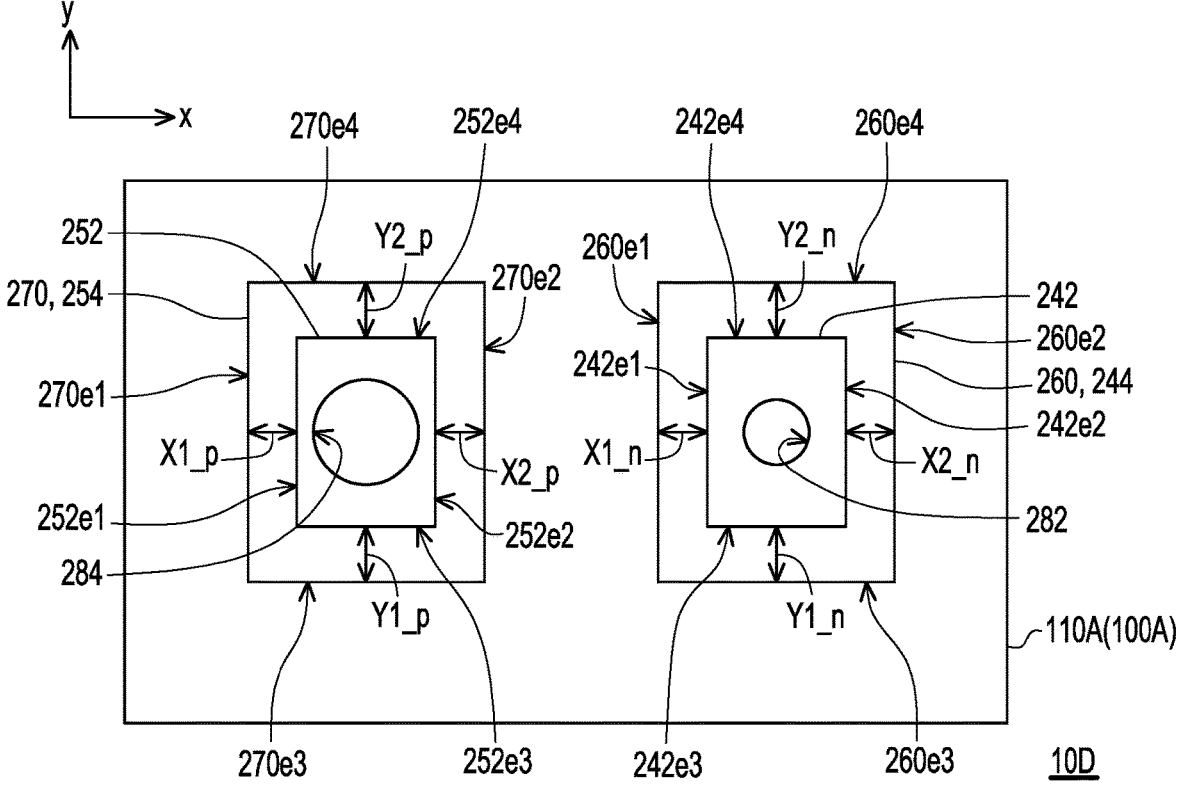
FIG. 10 is a schematic top view of a light emitting element substrate of another embodiment of the invention.

FIG. 9 is a schematic cross-sectional view of a light emitting element substrate of another embodiment of the invention. FIG. 10 is a schematic top view of a light emitting element substrate of another embodiment of the invention. FIG. 10 shows the substrate 100A, the first contact window 282, the second contact window 284, the first under barrier pattern 242, the first upper barrier pattern 244, the second under barrier pattern 252, the second upper barrier pattern 254, the first solder 260 and the second solder 270, while omitting other members.

A light emitting element substrate 10D of FIG. 9 and FIG. 10 is similar to the light emitting element substrate 10A of FIG. 3 and FIG. 4, and the difference between the two is that the materials of the first under barrier pattern 242 and the second under barrier pattern 252 are different. In detail, in the embodiment of FIG. 9 and FIG. 10, the materials of the first under barrier pattern 242 and the second under barrier pattern 252 are lighter than the materials of the first solder 260 and the second solder 270 respectively. In the process of transposing the light emitting element 200 of the light emitting diode wafer (such as the light emitting element substrate 100 of FIG. 1 and FIG. 2) onto the first temporary storage base 110A by using the laser lift-off method, the light emitting element 200 is heated, the electrically conductive pattern 246 and the first upper barrier pattern 244 are fused with the first solder 260, and the lighter first under barrier pattern 242 is diffused. In the process of transposing the light emitting element 200 of the light emitting diode wafer (such as the light emitting element substrate 100 of FIG. 1 and FIG. 2) onto the first temporary storage base 110A by using the laser lift-off method, the electrically conductive pattern 256 and the second upper barrier pattern 254 are fused with the second solder 270, and the lighter second under barrier pattern 252 is diffused. For example, in the embodiment of FIG. 9 and FIG. 10, the materials of the first under barrier pattern 242 and the second under barrier pattern 252 may include titanium (Ti) or platinum (Pt).

Figures 11, 12:
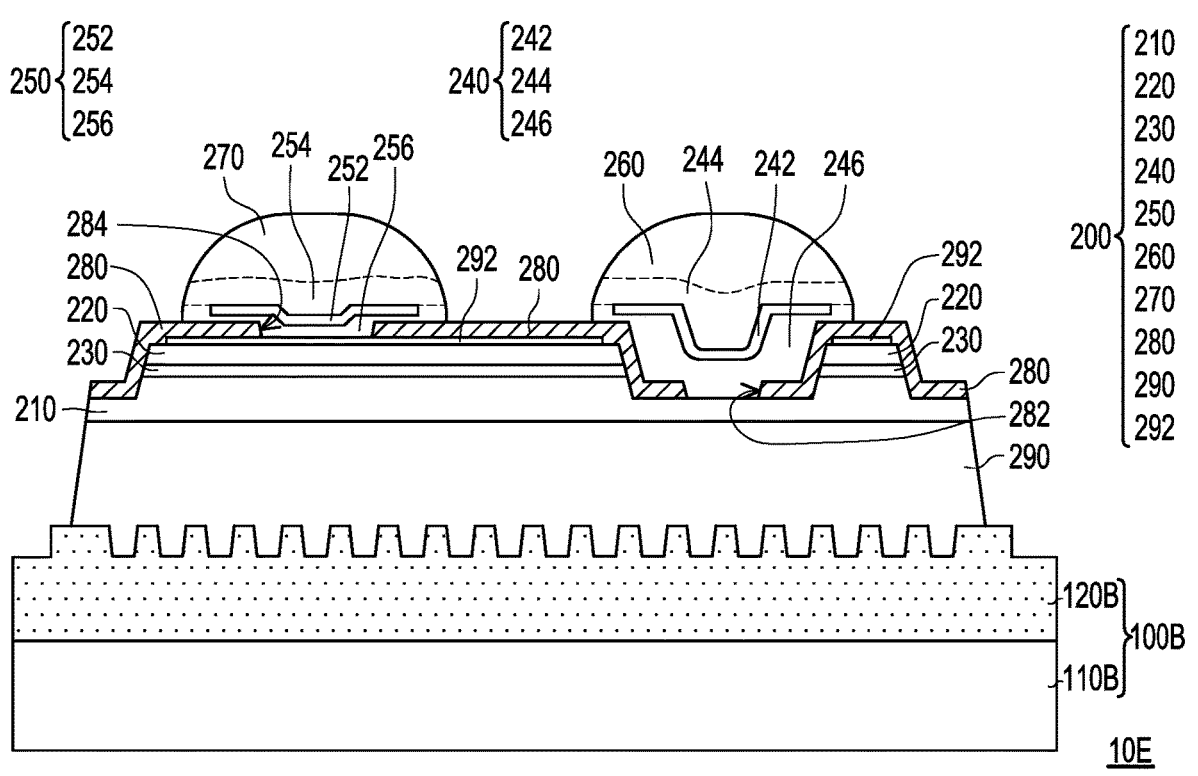
FIG. 11 is a schematic cross-sectional view of a light emitting element substrate of another embodiment of the invention.
FIG. 12 is a schematic top view of a light emitting element substrate of another embodiment of the invention.

FIG. 11 is a schematic cross-sectional view of a light emitting element substrate of another embodiment of the invention. FIG. 12 is a schematic top view of a light emitting element substrate of another embodiment of the invention. FIG. 11 shows the substrate 100B, the first contact window 282, the second contact window 284, the first under barrier pattern 242, the first upper barrier pattern 244, the second under barrier pattern 252, the second upper barrier pattern 254, the first solder 260 and the second solder 270, while omitting other members.

A light emitting element substrate 10E of FIG. 11 and FIG. 12 is formed by transposing the light emitting element 200 of the light emitting element substrate 10D of FIG. 9 and FIG. 10 onto the second temporary storage base 110B. The light emitting element substrate 10E of FIG. 11 and FIG. 12 is similar to the light emitting element substrate 10B of FIG. 5 and FIG. 6, and the difference between the two is that the materials of the first under barrier pattern 242 and the second under barrier pattern 252 are different. Specifically, in the embodiment of FIG. 11 and FIG. 12, the materials of the first under barrier pattern 242 and the second under barrier pattern 252 may include titanium (Ti) or platinum (Pt).

Figure 13:
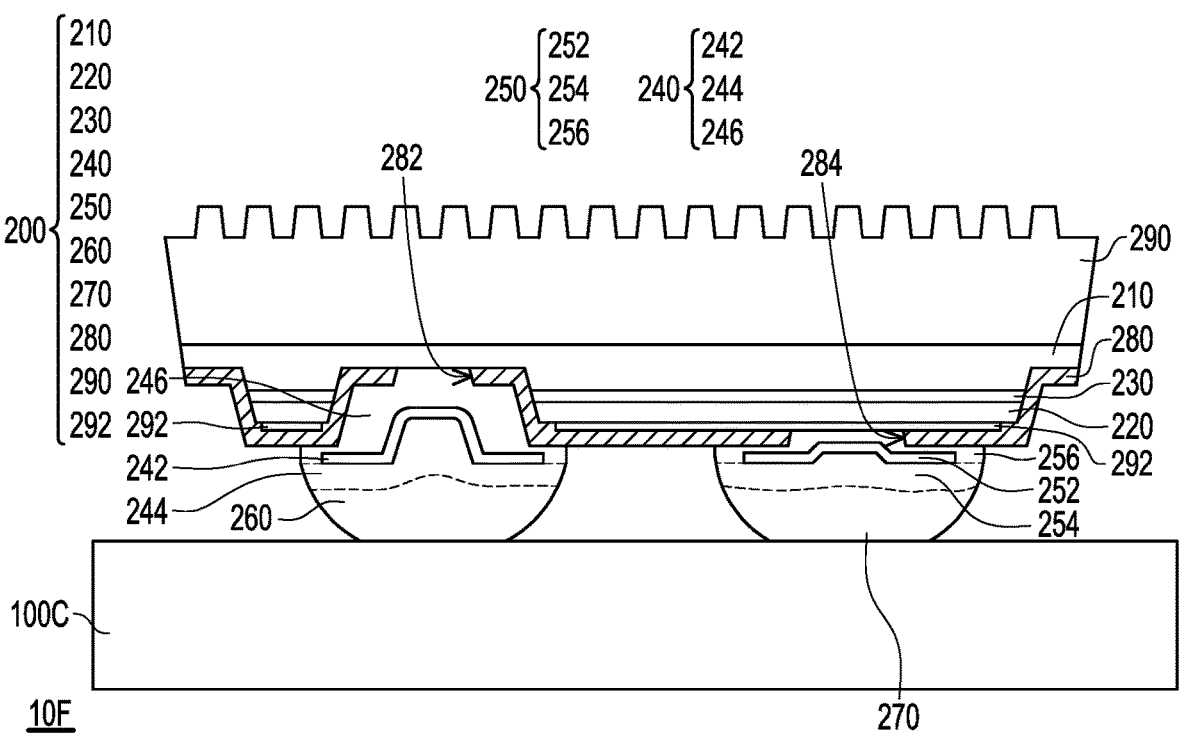
FIG. 13 is a schematic cross-sectional view of a display apparatus of an embodiment of the invention.
Figure 14:
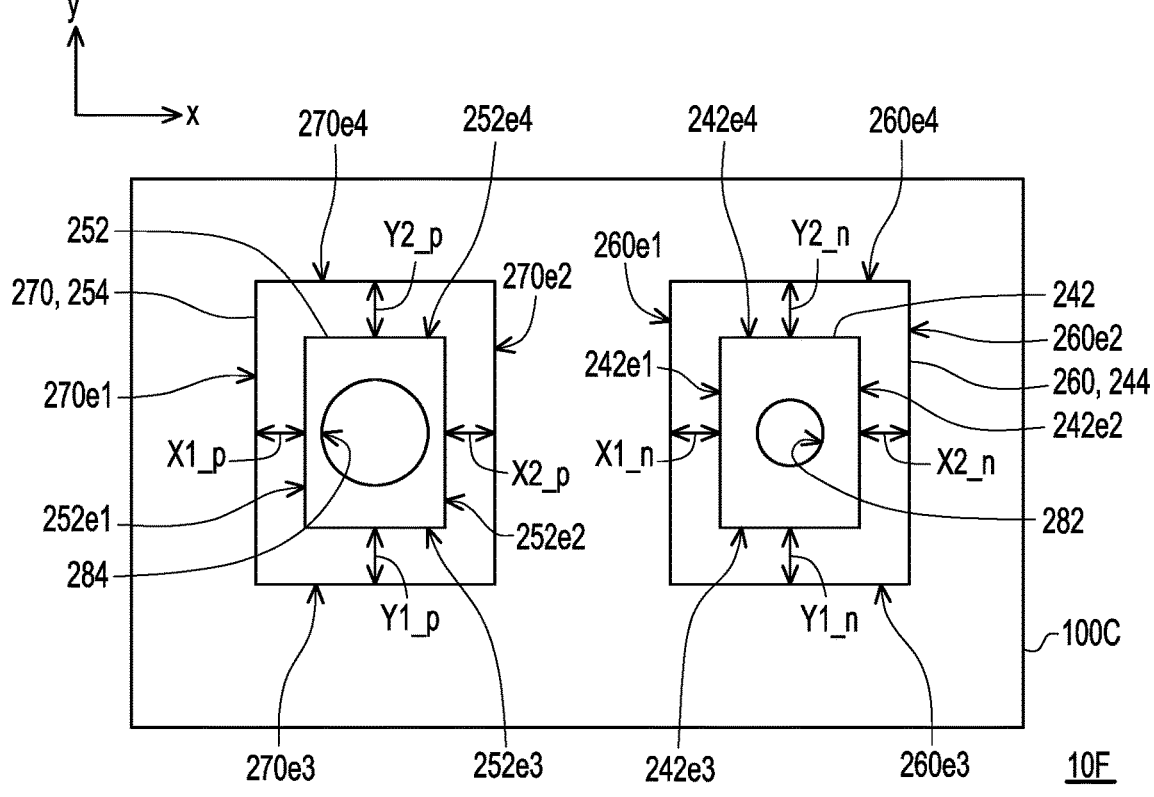
FIG. 14 is a schematic top view of a display apparatus of an embodiment of the invention.

FIG. 13 is a schematic cross-sectional view of a display apparatus of an embodiment of the invention. FIG. 14 is a schematic top view of a display apparatus of an embodiment of the invention. FIG. 13 shows the substrate 100C, the first contact window 282, the second contact window 284, the first under barrier pattern 242, the first upper barrier pattern 244, the second under barrier pattern 252, the second upper barrier pattern 254, the first solder 260 and the second solder 270, while omitting other members.

A display apparatus 10F of FIG. 13 and FIG. 14 is formed by transposing the light emitting element 200 of the light emitting element substrate 10E of FIG. 11 and FIG. 12 onto the substrate 100C. The display apparatus 10F of FIG. 13 and FIG. 14 is similar to the display apparatus 10C of FIG. 7 and FIG. 8, and the difference between the two is that the materials of the first under barrier pattern 242 and the second under barrier pattern 252 are different. Specifically, in the embodiment of FIG. 13 and FIG. 14, the materials of the first under barrier pattern 242 and the second under barrier pattern 252 may include titanium (Ti) or platinum (Pt).

What is claimed is:

1. A light emitting element substrate, comprising:
   a substrate; and
   a light emitting element disposed on the substrate, wherein the light emitting element comprises:
      a first semiconductor layer;
      a second semiconductor layer disposed opposite to the first semiconductor layer;
      an active layer disposed between the first semiconductor layer and the second semiconductor layer;
      a first electrode and a second electrode electrically connected to the first semiconductor layer and the second semiconductor layer respectively;
      a first solder and a second solder respectively disposed on the first electrode and the second electrode and electrically connected to the first electrode and the second electrode respectively;

wherein the first electrode comprises a first under barrier pattern, the first solder covers the first under barrier pattern, and a projection area of the first solder on the substrate is greater than a projection area of the first under barrier pattern on the substrate.

2. The light emitting element substrate of claim 1, wherein the first solder has a first edge and a second edge opposite to each other, and the first edge and the second edge of the first solder are arranged sequentially in a first direction; the first under barrier pattern has a first edge and a second edge opposite to each other, and the first edge and the second edge of the first under barrier pattern are arranged sequentially in the first direction; there is a distance between the first edge of the first solder and the first edge of the first under barrier pattern in the first direction, and there is a distance between the second edge of the first solder and the second edge of the first under barrier pattern in the first direction.

3. The light emitting element substrate of claim 2, wherein the first solder further has a third edge and a fourth edge, the third edge of the first solder is connected between the first edge and the second edge of the first solder, the fourth edge of the first solder is connected between the first edge and the second edge of the first solder and disposed opposite to the third edge of the first solder, the third edge and the fourth edge of the first solder are arranged sequentially in a second direction, the first direction and the second direction are intersected; the first under barrier pattern further has a third edge and a fourth edge, the third edge of the first under barrier pattern is connected between the first edge and the second edge of the first under barrier pattern, the fourth edge of the first under barrier pattern is connected between the first edge and the second edge of the first under barrier pattern and disposed opposite to the third edge of the first under barrier pattern, the third edge and the fourth edge of the first under barrier pattern are arranged sequentially in the second direction; there is a distance between the third edge of the first solder and the third edge of the first under barrier pattern in the second direction, and there is a distance between the fourth edge of the first solder and the fourth edge of the first under barrier pattern in the second direction.

4. The light emitting element substrate of claim 1, wherein the first solder covers a sidewall of the first under barrier pattern.

5. The light emitting element substrate of claim 1, wherein the first electrode further comprises:
a first upper barrier pattern located between the first solder and the first under barrier pattern, wherein the first upper barrier pattern covers the first under barrier pattern, and a projection area of the first upper barrier pattern on the substrate is greater than a projection area of the first under barrier pattern on the substrate.

6. The light emitting element substrate of claim 1, wherein the first electrode further comprises:
a first upper barrier pattern located between the first solder and the first under barrier pattern, wherein the first upper barrier pattern covers a sidewall of the first under barrier pattern.

7. The light emitting element substrate of claim 1, wherein the second electrode comprises:
a second under barrier pattern, wherein the second solder covers the second under barrier pattern, and a projection area of the second solder on the substrate is greater than a projection area of the second under barrier pattern on the substrate.

8. The light emitting element substrate of claim 7, wherein the second solder has a first edge and a second edge opposite to each other, and the first edge and the second edge of the second solder are arranged sequentially in a first direction; the second under barrier pattern has a first edge and a second edge opposite to each other, and the first edge and the second edge of the second under barrier pattern are arranged sequentially in the first direction; there is a distance between the first edge of the second solder and the first edge of the second under barrier pattern in the first direction, and there is a distance between the second edge of the second solder and the second edge of the second under barrier pattern in the first direction.

9. The light emitting element substrate of claim 8, wherein the second solder further has a third edge and a fourth edge, the third edge of the second solder is connected between the first edge and the second edge of the second solder, the fourth edge of the second solder is connected between the first edge and the second edge of the second solder and disposed opposite to the third edge of the second solder, the third edge and the fourth edge of the second solder are arranged sequentially in a second direction, the first direction and the second direction are intersected; the second under barrier pattern further has a third edge and a fourth edge, the third edge of the second under barrier pattern is connected between the first edge and the second edge of the second under barrier pattern, the fourth edge of the second under barrier pattern is connected between the first edge and the second edge of the second under barrier pattern and disposed opposite to the third edge of the second under barrier pattern, the third edge and the fourth edge of the second under barrier pattern are arranged sequentially in the second direction; there is a distance between the third edge of the second solder and the third edge of the second under barrier pattern in the second direction, and there is a distance between the fourth edge of the second solder and the fourth edge of the second under barrier pattern in the second direction.

10. The light emitting element substrate of claim 7, wherein the second solder covers a sidewall of the second under barrier pattern of the second electrode.

11. The light emitting element substrate of claim 7, wherein the second electrode further comprises:
a second upper barrier pattern located between the second solder and the second under barrier pattern, wherein the second upper barrier pattern covers the second under barrier pattern, and a projection area of the second upper barrier pattern on the substrate is greater than a projection area of the second under barrier pattern on the substrate.

12. The light emitting element substrate of claim 7, wherein the second electrode further comprises:
a second upper barrier pattern located between the second solder and the second under barrier pattern, wherein the second upper barrier pattern covers a sidewall of the second under barrier pattern.

13. A display apparatus, comprising:
a driving backplane; and
a light emitting element disposed on the driving backplane and electrically connected to the driving backplane, wherein the light emitting element comprises:
a first semiconductor layer;
a second semiconductor layer disposed opposite to the first semiconductor layer;
an active layer disposed between the first semiconductor layer and the second semiconductor layer;
a first electrode and a second electrode electrically connected to the first semiconductor layer and the second semiconductor layer respectively;

a first solder and a second solder respectively disposed on the first electrode and the second electrode and electrically connected to the first electrode and the second electrode respectively;

wherein the first electrode comprises a first under barrier pattern, the first solder covers the first under barrier pattern, and a projection area of the first solder on the driving backplane is greater than a projection area of the first under barrier pattern on the driving backplane.

14. The display apparatus of claim 13, wherein the first electrode further comprises:

a first upper barrier pattern located between the first solder and the first under barrier pattern, wherein the first upper barrier pattern covers the first under barrier pattern, and a projection area of the first upper barrier pattern on the driving backplane is greater than a projection area of the first under barrier pattern on the driving backplane.

15. The display apparatus of claim 13, wherein the second electrode comprises:

a second under barrier pattern, wherein the second solder covers the second under barrier pattern, and a projection area of the second solder on the driving backplane is greater than a projection area of the second under barrier pattern on the driving backplane.

16. The display apparatus of claim 15, wherein the second electrode further comprises:

a second upper barrier pattern located between the second solder and the second under barrier pattern, wherein the second upper barrier pattern covers the second under barrier pattern, and a projection area of the second upper barrier pattern on the driving backplane is greater than a projection area of the second under barrier pattern on the driving backplane.

* * * * *